(12) United States Patent
Nagano

(10) Patent No.: US 7,269,023 B2
(45) Date of Patent: Sep. 11, 2007

(54) DISPLAY PANEL DEVICE

(75) Inventor: Masahiro Nagano, Saitama (JP)

(73) Assignee: Sony Corporation, Tokyo (JP)

( * ) Notice: Subject to any disclaimer, the term of this patent is extended or adjusted under 35 U.S.C. 154(b) by 239 days.

(21) Appl. No.: 11/177,386

(22) Filed: Jul. 11, 2005

(65) Prior Publication Data
US 2006/0018092 A1 Jan. 26, 2006

(30) Foreign Application Priority Data

Jul. 12, 2004 (JP) ............. P2004-205322
May 31, 2005 (JP) ............. P2005-159446

(51) Int. Cl.
H05K 5/00 (2006.01)
(52) U.S. Cl. .............. 361/752; 361/683; 361/687; 361/688
(58) Field of Classification Search ........... 361/752, 361/800, 797, 790, 679, 683, 687, 688, 709, 361/681; 219/200; 345/156
See application file for complete search history.

(56) References Cited

U.S. PATENT DOCUMENTS 5,971,566 A * 10/1999 Tani et al. ............... 362/294
6,198,222 B1 * 3/2001 Chang ...................... 313/582
6,288,489 B1 * 9/2001 Isohata et al. ............ 313/582
7,072,179 B1 * 7/2006 Curran et al. ............ 361/687
2001/0005308 A1 * 6/2001 Oishi et al. .............. 361/687
2002/0048152 A1 4/2002 Kurihara et al.
2002/0153840 A1 * 10/2002 Isohata et al. ............ 313/582

FOREIGN PATENT DOCUMENTS

EP 1 382 991 A2 1/2004
JP 2003-150076 5/2003
WO WO 00/05620 2/2000

* cited by examiner

Primary Examiner—Tuan T. Dinh
Assistant Examiner—Hung S. Bui
(74) Attorney, Agent, or Firm—Finnegan, Henderson, Farabow, Garrett & Dunner, L.L.P.

(57) ABSTRACT

Left and right heat radiating plates are mounted on the rear side of a liquid crystal display panel in respective left and right positions thereon. The left and right heat radiating plates are of a substantially L-shaped cross section including a plurality of fins and respective supports near the center of the rear side of the liquid crystal display panel. A central rear cover has a plurality of fins and has left and right ends fixedly mounted respectively on the supports of the left and right heat radiating plates in covering relation to a circuit assembly on the rear side of the liquid crystal display panel. Left and right rear covers are mounted respectively on rear sides of the left and right heat radiating plates and lie substantially flush with the central rear cover.

5 Claims, 7 Drawing Sheets

DISPLAY PANEL DEVICE

BACKGROUND OF THE INVENTION

The present invention relates to a display panel device such as a liquid crystal display panel device or the like.

Display panel devices such as liquid crystal display panel devices or the like which have large screen sizes are required to have increased display panel strength for higher rigidity and also to discharge heat generated in the devices reliably and effectively out of the devices.

Japanese Patent Laid-open No. 2003-150076 discloses a liquid crystal display panel device having a liquid crystal display panel that is fixed to a front cover by left, right, and central stays extending in the transverse direction of the front cover and pressing peripheral edges of the liquid crystal display panel. The disclosed liquid crystal display panel device also has a planar rear cover mounted on the rear side of the liquid crystal display panel.

However, the liquid crystal display panel device of the above construction fails to provide sufficiently increased display panel strength for sufficiently high rigidity and also fails to discharge heat generated in the device reliably and effectively out of the device.

SUMMARY OF THE INVENTION

It is therefore an embodiment of the present invention to provide a liquid crystal display panel device of simple structure which has increased display panel strength for higher rigidity and which is capable of discharging heat generated in the device reliably and effectively out of the device.

According to the present invention, there is provided a display panel device including a display panel having a rear side, a left heat radiating plate mounted on the rear side of the display panel in a left position thereof, the left heat radiating plate having a substantially L-shaped cross section including a vertically extending support disposed on an end thereof close to a center of the rear side, a right heat radiating plate mounted on the rear side of the display panel in a right position thereof, the right heat radiating plate having a substantially L-shaped cross section including a vertically extending support disposed on an end thereof close to the center of the rear side in confronting relation to the support of the left heat radiating plate, a central rear cover having left and right ends fixedly mounted respectively on the supports of the left heat radiating plate and the right heat radiating plate, a left rear cover mounted on a rear side of the left heat radiating plate, and a right rear cover mounted on a rear side of the right heat radiating plate.

With the above arrangement, the left heat radiating plate, the right heat radiating plate, and the central rear cover are mounted on the rear side of the display panel, and the left heat radiating plate and the right heat radiating plate function as stiffening members having the mechanical strength of L-shaped angles and are of a substantially L-shaped cross section, the left heat radiating plate and the right heat radiating plate having the vertically extending supports near the center of the rear side of the display panel. Since the central rear cover extends and is secured in place between the supports, which confront each other, of the left heat radiating plate and the right heat radiating plate, the mechanical strength of the display panel is sufficiently increased, and the rigidity of the display panel device is also sufficiently increased.

As the left heat radiating plate and the right heat radiating plate cover left and right areas of the rear side of the display panel and have their supports joined to the central rear cover, heat generated in the display panel device is reliably and effectively radiated out of the display panel device.

If the central rear cover includes a heat radiating plate having a plurality of fins, then the central rear cover can easily be formed as an aluminum extrusion or the like. Since the central rear cover with the fins extend over a wide central area of the rear side of the display panel, the rear side of the display panel device provides excellent designability for better functional appearance.

The above and other embodiments, features, and advantages of the present invention will become apparent from the following description when taken in conjunction with the accompanying drawings which illustrate preferred embodiments of the present invention by way of example.

BRIEF DESCRIPTION OF THE PREFERRED EMBODIMENT

Figure 1:
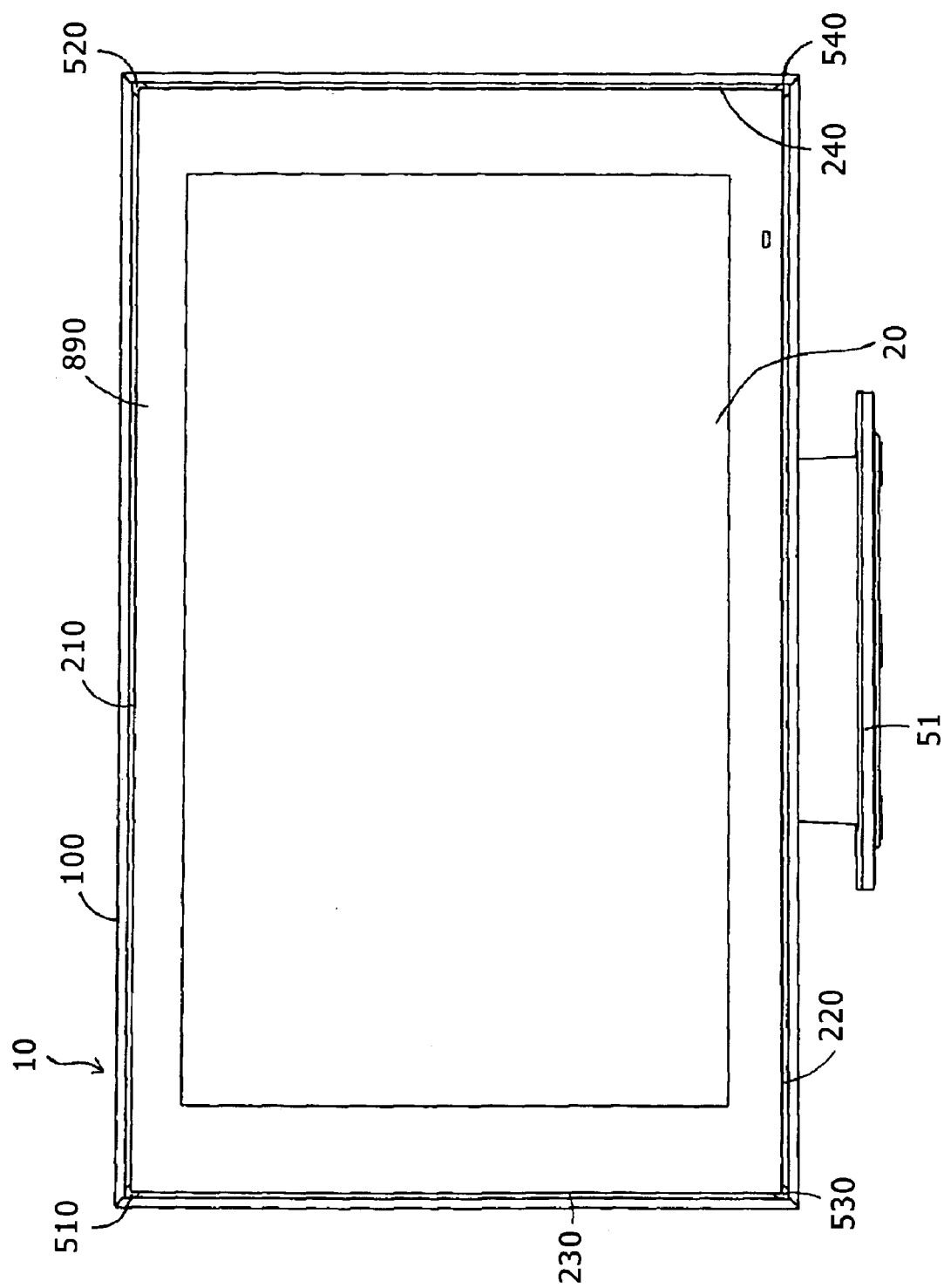
FIG. 1 is a front elevational view of a liquid crystal display panel device according to the present invention, which is used as a self-standing liquid crystal display panel device.

1. Self-Standing Display Panel Device (FIGS. 1 to 5):

As shown in FIG. 1, a display panel device according to the present invention, which is constructed as a self-standing liquid crystal display panel device, includes a frame assembly 10 and a liquid crystal display panel 20 which are mounted on a stand 51.

The frame assembly 10 includes an outer frame 100, an inner frame (cabinet) that is omitted from illustration in FIG. 1, a transparent upper side plate 210, a transparent lower side plate 220, a transparent left side plate 230, and a transparent right side plate 240 which are interposed between the outer frame 100 and the inner frame. The outer frame 100 has upper left, upper right, lower left, and lower right corners combined with respective corner covers 510, 520, 530 and 540.

The transparent upper side plate 210, the transparent lower side plate 220, the transparent left side plate 230, and the transparent right side plate 240 serve to create a floating effect which makes the display screen of the liquid crystal display panel 20 look floating in the air by making a wall behind the liquid crystal display panel device visible through the transparent upper side plate 210, the transparent lower side plate 220, the transparent left side plate 230, and the transparent right side plate 240.

Each of the transparent upper side plate 210, the transparent lower side plate 220, the transparent left side plate 230, and the transparent right side plate 240 is formed as an acrylic plate or a polycarbonate plate, and has a thickness of about 10 mm in the vertical or horizontal direction and a width of at least about several cm along the depth, i.e., in the front-to-rear direction. Therefore, the width is greater than the thickness.

The liquid crystal display panel 20 is mounted in the inner frame, and has a liquid crystal display unit, a backlight, and a circuit and a power supply for energizing the liquid crystal display unit and the backlight. The liquid crystal display panel device has left and right speakers disposed within the inner frame.

The display screen of the liquid crystal display panel 20 has peripheral edges spaced inwardly from the inner edges of the transparent upper side plate 210, the transparent lower side plate 220, the transparent left side plate 230, and the transparent right side plate 240. The space between the peripheral edges of the display screen and the inner edges of the side plates 210, 220, 230, 240 is covered with a front mask 890 for concealing an inner structure of the liquid crystal display panel device.

The front mask 890 has a number of small circular holes (not shown) defined in each of the areas thereof which are aligned with the respective left and right speakers.

In the description which follows, the terms "vertical", "upper", "lower", "horizontal", "left", and "right", etc. are used with respect to the display screen of the liquid crystal display panel 20 as shown in FIG. 1, and the term "depth" is used to represent a direction normal to the display screen, i.e., the sheet of FIG. 1. The terms "inward", "inner", "outward", and "outer", etc. are used with respect to the geometric center of the display screen. The terms "forward" and "front" are used to represent a direction toward the viewer of FIG. 1, and the terms "rearward" and "rear" are used to represent a direction away from the viewer of FIG. 1.

Figure 2:
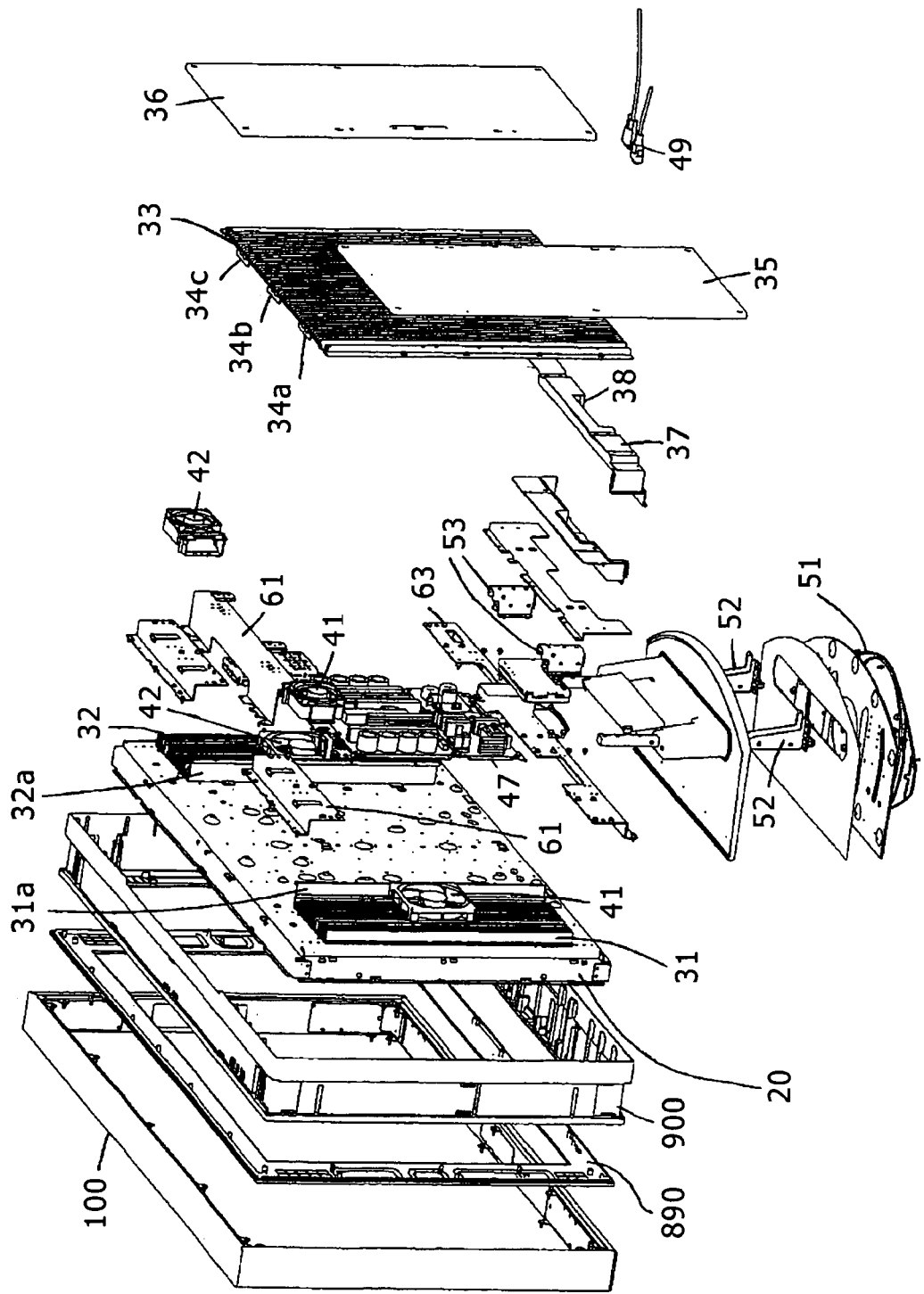
FIG. 2 is an exploded perspective view of components of the crystal display panel device according to the present invention.

FIG. 2 shows in exploded perspective components of the crystal display panel device according to the present invention. The outer frame 100 includes an outer frame upper side plate, an outer frame lower side plate, an outer frame left side plate, and an outer frame right side plate which are formed as aluminum extrusions, for example, and interfitted at the corners.

The transparent upper side plate 210, the transparent lower side plate 220, the transparent left side plate 230, and the transparent right side plate 240, shown in FIG. 1, are applied by double-sided adhesive tapes to the respective inner sides of the outer frame upper side plate, the outer frame lower side plate, the outer frame left side plate, and the outer frame right side plate.

Holders having mounting lugs on their inner sides are applied by double-sided adhesive tapes to the respective inner sides of the transparent upper side plate 210, the transparent lower side plate 220, the transparent left side plate 230, and the transparent right side plate 240.

The outer frame 100, to which the holders, the transparent upper side plate 210, the transparent lower side plate 220, the transparent left side plate 230, and the transparent right side plate 240 are applied, is mounted on an inner frame 900 by the lugs that are fastened to the inner frame 900 by screws. The inner frame 900 is integrally molded of plastics.

The liquid crystal display panel 20 is mounted in the inner frame 900, and the front mask 890 is mounted on a front side of the inner frame 900.

A left heat radiating plate 31 and a right heat radiating plate 32 are mounted on the rear side of the liquid crystal display panel 20 respectively in left and right positions thereon. Each of the left heat radiating plate 31 and the right heat radiating plate 32 has a plurality of vertically extending fins that are spaced horizontally. The left heat radiating plate 31 and the right heat radiating plate 32 have vertically extending supports 31a, 32a, respectively, at their ends closer to the center of the rear side of the liquid crystal display panel 20, i.e., at the right end of the left heat radiating plate 31 and the left end of the right heat radiating plate 32, respectively. The supports 31a, 32a are higher than the fins. The left heat radiating plate 31 and the right heat radiating plate 32 are of a substantially L-shaped cross section, and are in the form of aluminum extrusions having identical cross-sectional shapes, for example.

Since the left heat radiating plate 31 and the right heat radiating plate 32 have the integrally formed supports 31a, 32a, they function as stiffening members having the mechanical strength of L-shaped angles, as a whole.

Fans 41, 42 are mounted on the respective rear surfaces of the left heat radiating plate 31 and the right heat radiating plate 32. In FIG. 2, two fans 41 and two fans 42 are illustrated. One of the two fans 41 is shown as a mounted fan 41 and the other as a fan 41 prior to being mounted. Similarly, one of the two fans 41 is shown as a mounted fan 41 and the other as a fan 42 prior to being mounted.

The stand 51 has stand posts 52 combined with respective stand holders 53. The stand 51 is attached to the rear side of the liquid crystal display panel 20 by the stand holders 53.

A circuit assembly (circuit board) 47 including a power supply circuit and a driver circuit is mounted on the rear side of the liquid crystal display panel 20 between the support 31a formed on the right end of the left heat radiating plate 31 and the support 32a formed on the left end of the right heat radiating plate 32.

A central rear cover 33 which covers the circuit assembly 47 is also mounted on the rear side of the liquid crystal display panel 20 between the left heat radiating plate 31 and the right heat radiating plate 32 at a position behind the left heat radiating plate 31 and the right heat radiating plate 32.

The central rear cover 33 includes a plurality of vertically extending fins that are spaced horizontally, as with the left heat radiating plate 31 and the right heat radiating plate 32, and is formed as aluminum extrusions, for example.

It is difficult to form the central rear cover 33 as a single extrusion having a large horizontal width. Actually, as also shown in FIG. 3, the central rear cover 33 includes four cover members 33a, 33b, 33c, 33d that are horizontally joined by joints 34a, 34b, 34c.

Figure 3:
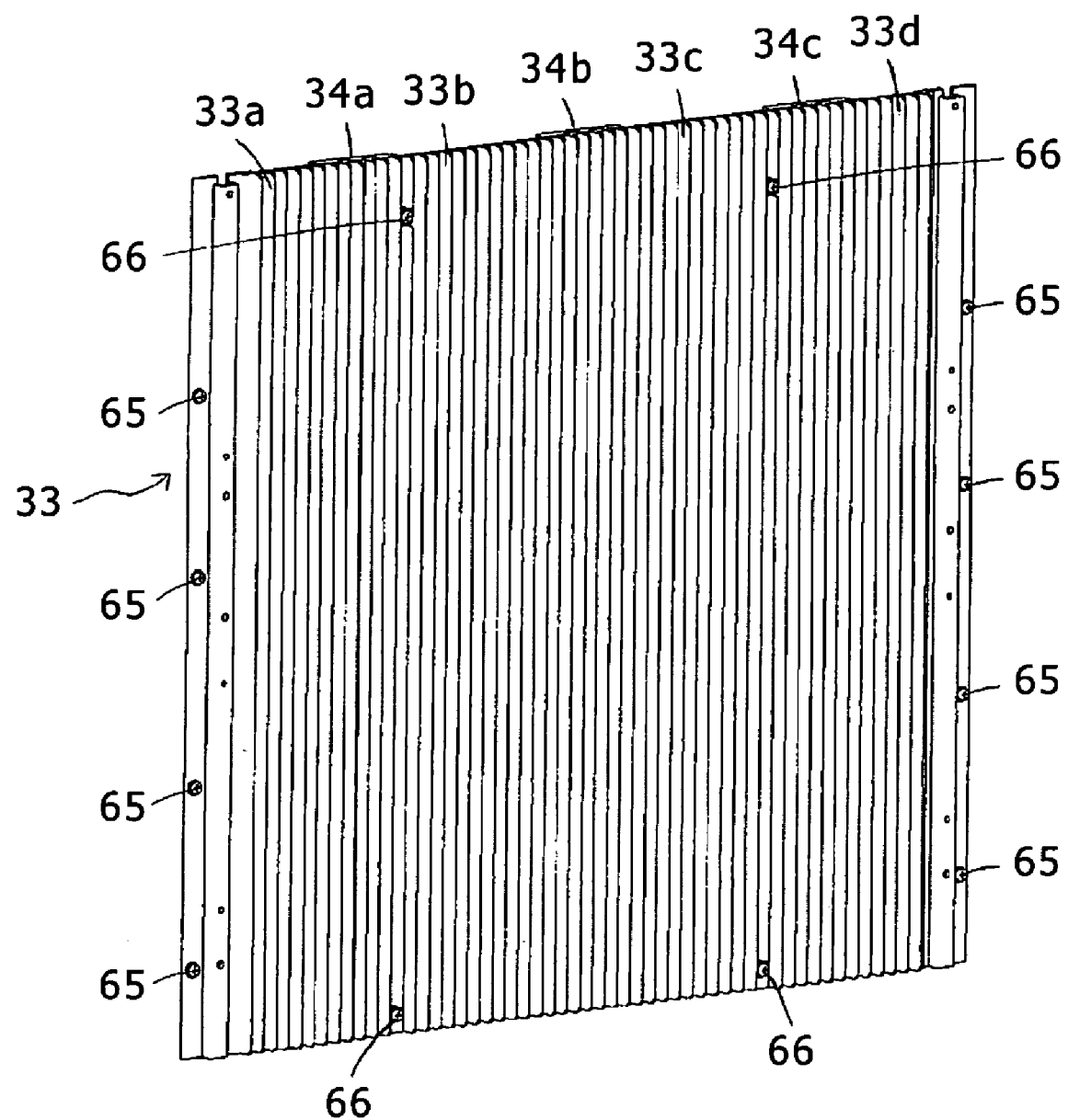
FIG. 3 is a perspective view of a central rear cover of the crystal display panel device according to the present invention.

The central rear cover 33 is mounted on a stay 61 in an upper position on the rear side of the liquid crystal display panel 20 by screws 66 shown in FIG. 3 and a stay 63 in a lower position on the rear side of the liquid crystal display panel 20 by screws 66 shown in FIG. 3, in covering relation to the circuit assembly 47.

Figure 4:
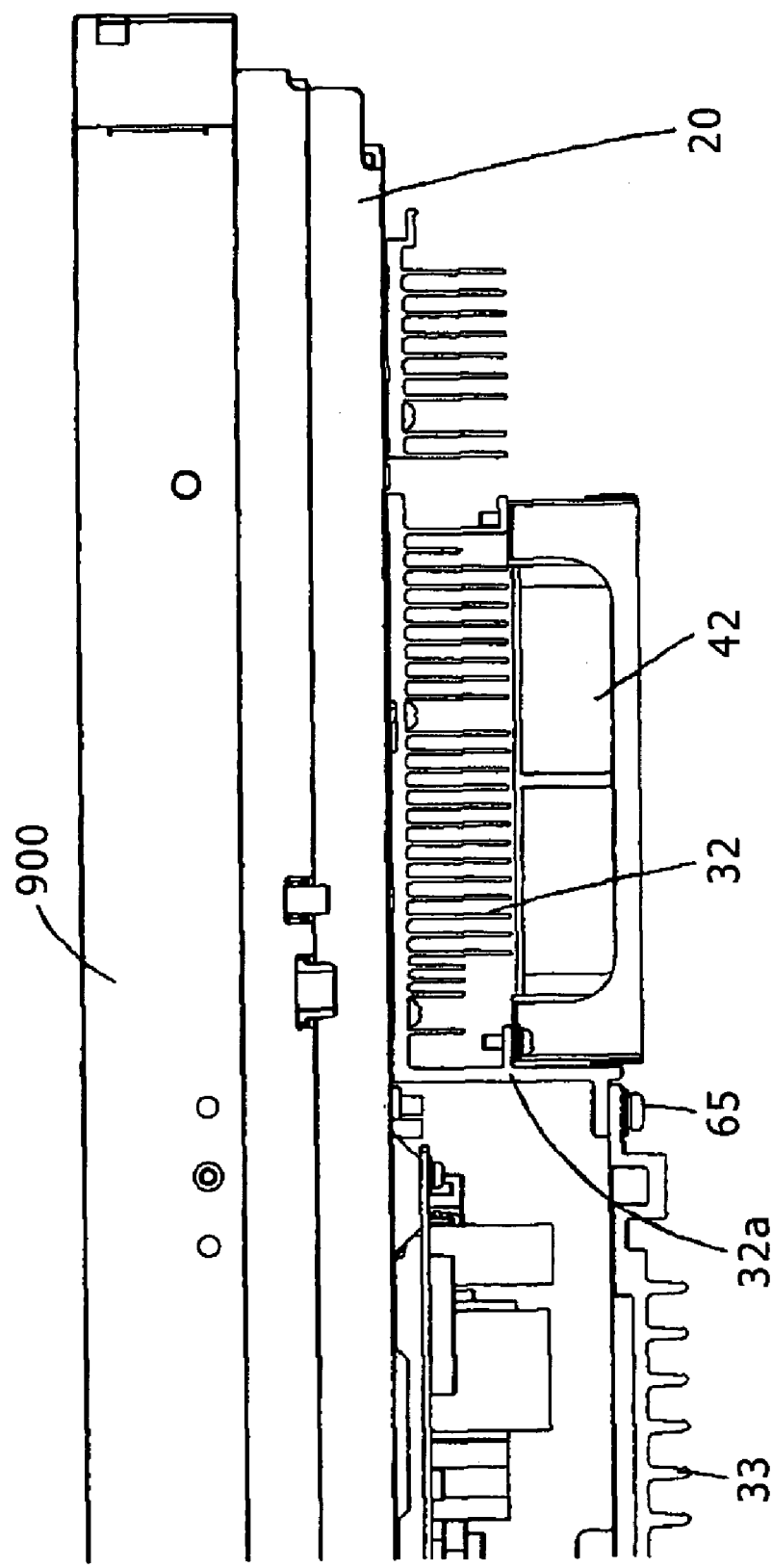
FIG. 4 is a fragmentary plan view of the crystal display panel device according to the present invention.

FIG. 4 shows a right mounting structure on the rear side of the liquid crystal display panel 20. The central rear cover 33 has a right end fastened by screws 65 to the support 32a on the left end of the right heat radiating plate 32. The central rear cover 33 has a left end fastened by screws 65 (see FIG. 3) to the support 31a on the right end of the left heat radiating plate 31.

Figure 5:
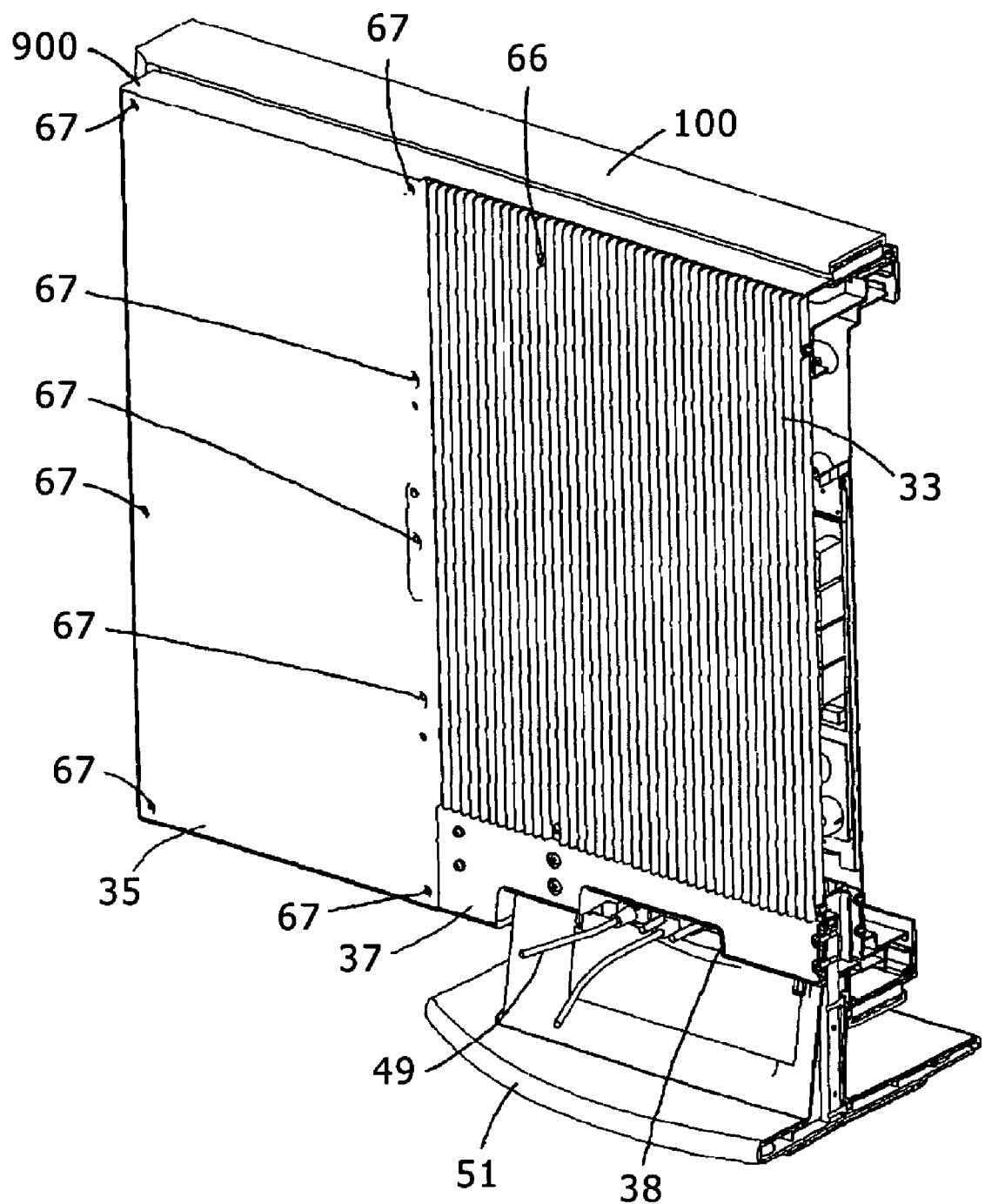
FIG. 5 is a perspective view, partly cut away, showing a rear structure of the crystal display panel device according to the present invention.

As shown in FIG. 5, a connector bracket 37 is mounted on a lower side of the central rear cover 33. The connector bracket 37 has a lower window 38 into which connector plugs 49 are inserted for supplying electric power and signals to the circuit assembly 47.

A left rear cover 35 and a right rear cover 36 are mounted on the rear side of the liquid crystal display panel 20 in covering relation to the left heat radiating plate 31 and the right heat radiating plate 32, respectively. The left rear cover 35 and the right rear cover 36 lie substantially flush with the central rear cover 33. Unlike the central rear cover 33, the left rear cover 35 and the right rear cover 36 are formed as flat plastic moldings. The left rear cover 35 and the right rear cover 36 are fastened to the inner frame 900 and the central rear cover 33 by screws 67.

According to the rear structure of the liquid crystal display panel 20 as described above, the left heat radiating plate 31, the right heat radiating plate 32, and the central rear cover 33 are mounted on the rear side of the liquid crystal display panel 20, and the left heat radiating plate 31 and the right heat radiating plate 32 function as stiffening members having the mechanical strength of L-shaped angles and are of a substantially L-shaped cross section, the left heat radiating plate 31 and the right heat radiating plate 32 having the vertically extending supports 31a, 32a near the center of the rear side of the liquid crystal display panel 20. Since the central rear cover 33 extends and is secured in place between the supports 31a, 32a, which confront each other, of the left heat radiating plate 31 and the right heat radiating plate 32, the mechanical strength of the liquid crystal display panel 20 is sufficiently increased, and the rigidity of the liquid crystal display panel device is also sufficiently increased.

As the left heat radiating plate 31, the right heat radiating plate 32, and the central rear cover 33, each having fins, extend substantially fully over the rear side of the liquid crystal display panel 20, heat generated in the liquid crystal display panel device is reliably and effectively discharged out of the liquid crystal display panel device.

Particularly, heat generated by the liquid crystal display panel 20 is reduced by the left heat radiating plate 31 and the right heat radiating plate 32, and transferred to the central rear cover 33, which radiates the heat through its fins.

Because the central rear cover 33 having fins and formed as an aluminum extrusion, for example, extends over a wide central area of the rear side of the liquid crystal display panel 20, the rear side of the liquid crystal display panel device provides excellent designability for a better functional appearance. The left rear cover 35 and the right rear cover 36 which lie substantially flush with the central rear cover 33 and are disposed one on each side of the central rear cover 33 provide an improved appearance.

If the central rear cover 33, the left rear cover 35 and the right rear cover 36 are made of one material such as aluminum and coated in one color, then they provide excellent designability.

2. Wall-Mounted Crystal Display Panel Device (FIGS. 6, 7):

A display panel device according to the present invention may be constructed as a wall-mounted display panel device.

Figure 6:
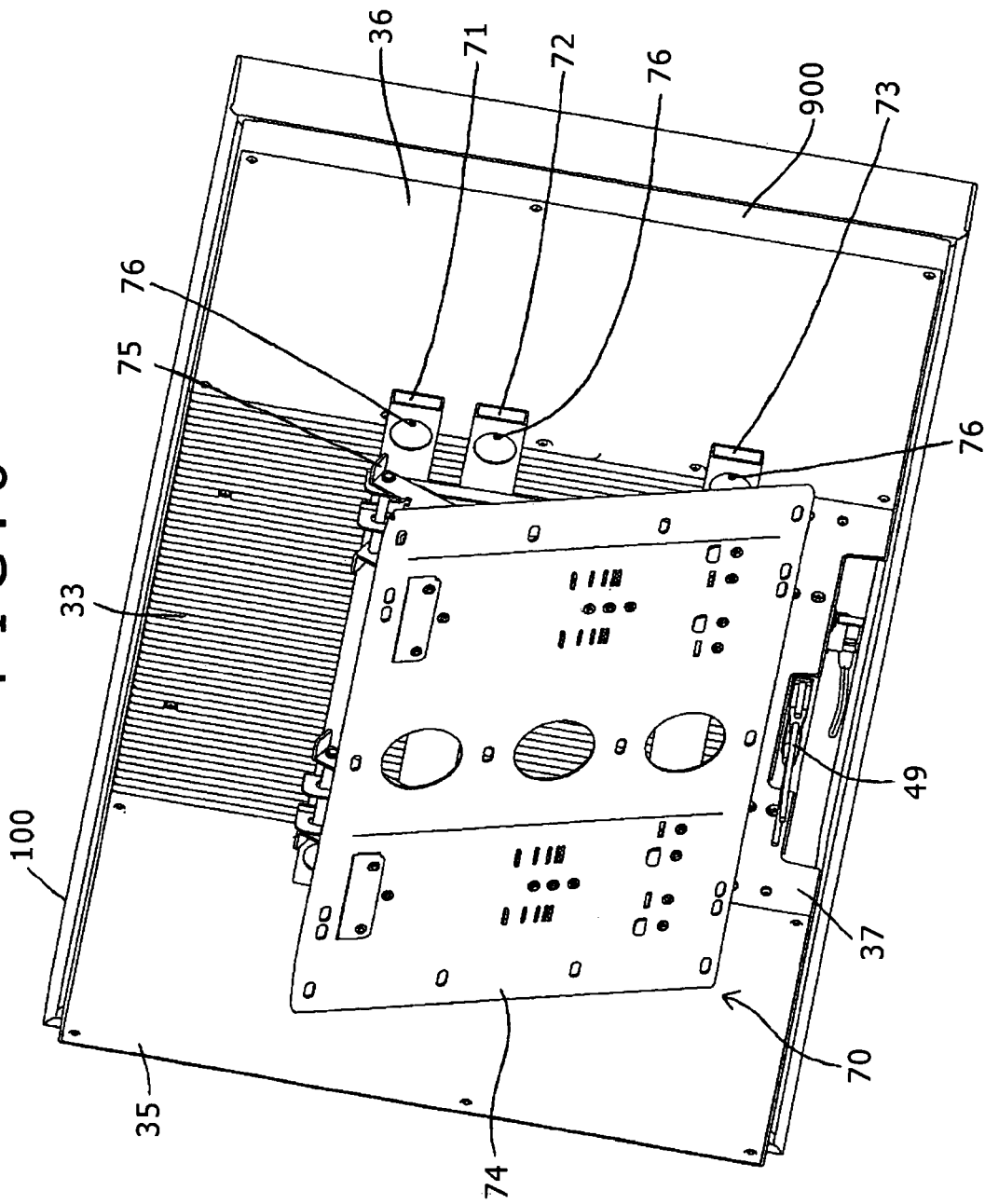
FIG. 6 is a rear view of the crystal display panel device according to the present invention, which is used as a wall-mounted crystal display panel device.

FIG. 6 shows a wall-mounted liquid crystal display panel device 5. The wall-mounted liquid crystal display panel device 5 includes a liquid crystal display panel 20 whose rear structure is essentially identical to the rear structure shown in FIGS. 1 through 5 except that it does not have a stand and related parts. Therefore, those parts of the wall-mounted liquid crystal display panel device 5 which are identical to those of the self-standing liquid crystal display panel device are denoted by identical reference numerals and will not be described in detail below.

Figure 7:
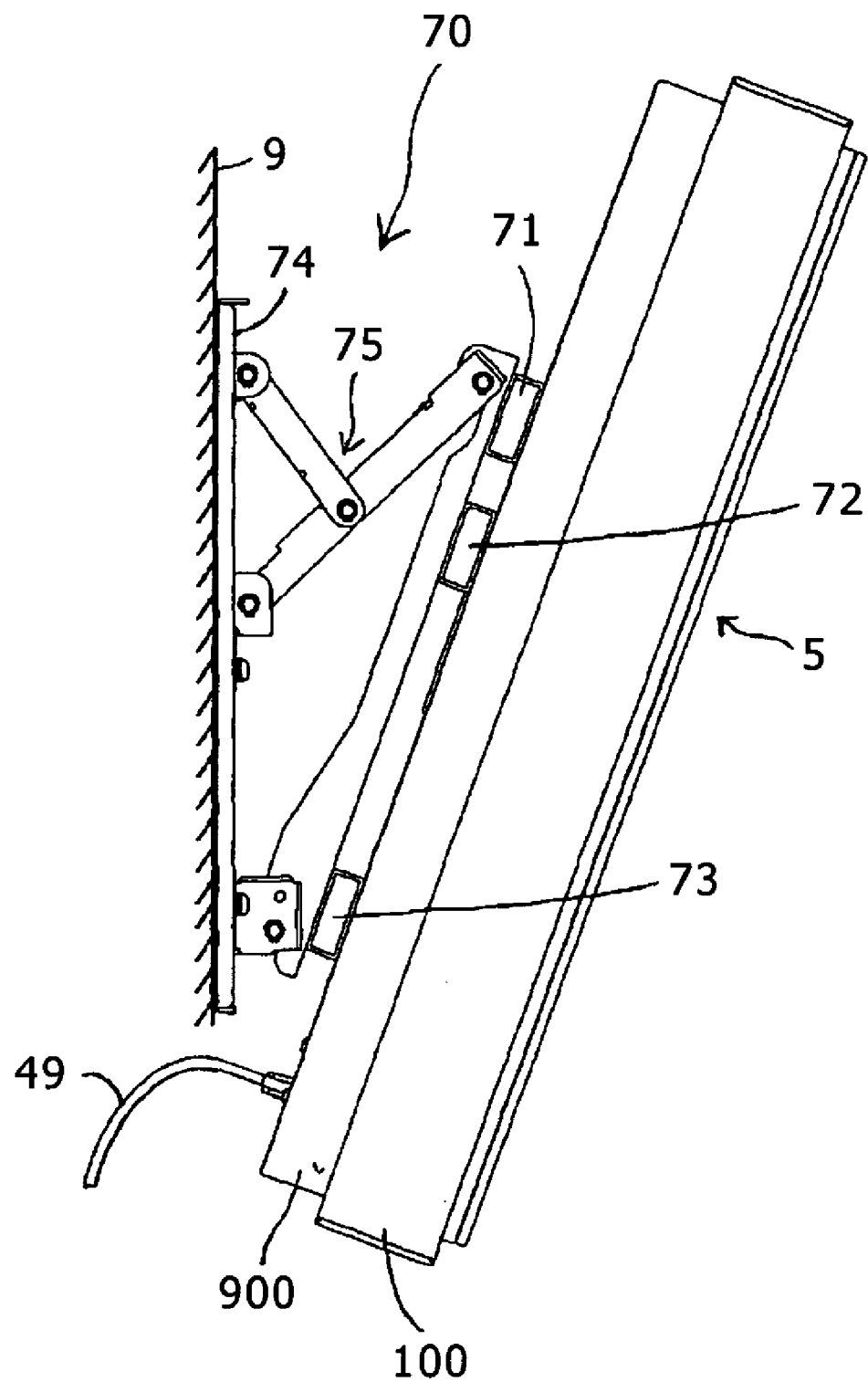
FIG. 7 is a side elevational view of the wall-mounted crystal display panel device shown in FIG. 6.

As shown in FIG. 7, the wall-mounted liquid crystal display panel device 5 has a wall-mounting unit 70 on the rear side thereof.

The wall-mounting unit 70 includes mounting bars 71, 72 and 73, each in the form of a pipe having a rectangular cross section, extending horizontally between the left rear cover 35 and the right rear cover 36 on the rear side of the liquid crystal display panel device 5 and fastened to the central rear cover 33 through the left rear cover 35 and the right rear cover 36 by screws 76. The mounting bars 71, 72 and 73 are coupled to a mounting plate 74 fixed to a wall 9 by a collapsible link mechanism 75.

The collapsible link mechanism 75 allows the liquid crystal display panel device 5 to be angularly moved between a tilted position in which the liquid crystal display panel device 5 is tilted away from the wall 9 as shown in FIG. 7 and a parallel position in which the liquid crystal display panel device 5 is parallel to the wall 9.

3. Other Embodiment:

The display panel device according to the present invention has been described as a liquid crystal display panel device. However, the principles of the present invention are also applicable to any of various other display panel devices, such as a plasma display panel device.

Although certain preferred embodiments of the present invention have been shown and described in detail, it should be understood that various changes and modifications may be made therein without departing from the scope of the appended claims.

What is claimed is:

1. A display panel device comprising:
   a display panel having a rear side;
   a left heat radiating plate mounted on the rear side of said display panel in a left position thereof, said left heat radiating plate having a substantially L-shaped cross section comprising a vertically extending support disposed on an end thereof close to a center of said rear side;
   a right heat radiating plate mounted on the rear side of said display panel in a right position thereof, said right heat radiating plate having a substantially L-shaped cross section comprising a vertically extending support disposed on an end thereof close to the center of said rear side in confronting relation to the support of said left heat radiating plate;
   a central rear cover having left and right ends fixedly mounted respectively on the supports of said left heat radiating plate and said right heat radiating plate;
   a left rear cover mounted on a rear side of said left heat radiating plate; and
   a right rear cover mounted on a rear side of said right heat radiating plate.

2. The display panel device according to claim 1, wherein said central rear cover has a plurality of vertically extending fins which are spaced horizontally.

3. The display panel device according to claim 2, wherein said central rear cover comprises an aluminum extrusion.

4. The display panel device according to claim 1, wherein said display panel comprises a liquid crystal display panel.

5. The display panel device according to claim 1, further comprising:

a wall-mounting unit mounted on said central rear cover near the left and right ends thereof which are fixedly mounted respectively on the supports of said left heat radiating plate and said right heat radiating plate.

* * * * *